(12) United States Patent
Zuffada et al.

(10) Patent No.: US 6,777,998 B2
(45) Date of Patent: Aug. 17, 2004

(54) INTEGRATED ELECTRONIC CIRCUIT INCLUDING NON-LINEAR DEVICES

(75) Inventors: Maurizio Zuffada, Milan (IT); Giorgio Betti, Pogliano Milanese (IT); Francesco Chrappan Soldavini, San Donato Milanese (IT); Martin Aureliano Hassner, Mountain View (IT)

(73) Assignees: STMicroelectronics S.r.l., Agrate Brianza (IT); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/216,562

(22) Filed: Aug. 9, 2002

(65) Prior Publication Data

US 2003/0058024 A1 Mar. 27, 2003

(30) Foreign Application Priority Data

Aug. 10, 2001 (EP) .............................. 01830536

(51) Int. Cl.$^7$ .............................. G06F 7/64; G06G 7/18; G06G 7/19

(52) U.S. Cl. ....................................... 327/334; 327/350

(58) Field of Search .................................. 327/334, 346, 327/350, 351, 560–563

(56) References Cited

U.S. PATENT DOCUMENTS

| | | | | |
|---|---|---|---|---|
| 3,636,338 A | * | 1/1972 | Abnett et al. ................ | 327/350 |
| 3,676,792 A | * | 7/1972 | Newton ........................ | 330/52 |
| 4,383,230 A | | 5/1983 | Manzolini .................... | 333/214 |
| 4,568,978 A | * | 2/1986 | Cosh ........................... | 327/352 |
| 4,607,140 A | * | 8/1986 | Schorr ......................... | 379/400 |
| 4,644,306 A | | 2/1987 | Kleinberg .................... | 333/214 |
| 5,126,846 A | * | 6/1992 | Niimura ...................... | 348/613 |
| 6,060,934 A | | 5/2000 | Landolt ....................... | 327/334 |
| 6,060,935 A | * | 5/2000 | Shulman ..................... | 327/345 |

* cited by examiner

*Primary Examiner*—Quan Tra
(74) *Attorney, Agent, or Firm*—Lisa K. Jorgenson; Allen, Dyer, Doppelt, Milbrath & Gilchrist, P.A.

(57) ABSTRACT

An integrated electronic circuit includes a plurality of active circuits connected together in cascade. A feedback loop is between an output of a last active circuit and an input of a first active circuit so that the plurality of active devices function as a non-linear device, such as a capacitor. The integrated electronic circuit may be integrated or used in association with a circuit network including other non-linear devices.

16 Claims, 2 Drawing Sheets

INTEGRATED ELECTRONIC CIRCUIT INCLUDING NON-LINEAR DEVICES

FIELD OF THE INVENTION

The present invention relates generally to non-linear electronic devices, such as non-linear capacitors. More specifically, but not exclusively, the present invention relates to an electronic device integrated on a semiconductor substrate, with the electronic device being integrated or used in association with a circuit network including non-linear devices.

BACKGROUND OF THE INVENTION

Data detection for transmission channels is based on the use of a network of non-linear devices, as readily understood by those skilled in the art. Data detection with non-linear devices is becoming more popular because of the simplicity of the circuit networks, including such non-linear devices, and because of a corresponding lower production cost.

A circuit network including non-liner devices requires that the non-linearity of such devices be well controlled and follow a well-defined rule. Once these conditions are met, then the resulting network provides some advantages in data detection when compared with other more complex approaches.

The devices used in this kind of network are usually capacitors and inductors that have a non-linear relation between capacitance and voltage for the capacitors, and a non-linear relation between inductance and current for the inductors. One of the main difficulties for manufacturing an integrated circuit network including non-linear devices is that the non-linear components are to be provided as discrete elements. An integrated non-linear capacitor or inductor is hard to form based upon current technology.

For instance, U.S. Pat. No. 6,166,604 relates to a semiconductor amplifier including a distortion compensation circuit. The disclosed amplifier comprises a non-linear amplifying element connected to an integrated capacitor that prevents a direct current from flowing through a passive circuit. The integrated capacitor is formed in a known manner.

Up to now, there have not been any straightforward approaches for easily integrating an electronic circuit that includes non-linear passive components. Consequently, there is a need for implementing non-linear passive devices into a semiconductor electronic circuit, thus allowing the construction of a network of non-linear devices for data detection in transmission channels.

SUMMARY OF THE INVENTION

The scope of the present invention is to provide a method for integrating a non-linear passive device, such as a non-linear capacitor, and to provide a corresponding circuit.

More specifically, the present invention may provide a non-linear capacitor with the following relationship:

$$C = C_0 \cdot \frac{1}{1 - k \cdot V_c^2}$$

The present invention is based on the fact that non-linear passive devices are formed by using active components connected in a feedback loop for emulating the same behavior of the non-linear passive device. In other words, the present invention utilizes active devices operating in a feedback loop to implement the function of a non-linear capacitor.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

A more complete understanding of the present invention may be had by reference to the following detailed description when taken in conjunction with the accompanying drawings, wherein.

DETAILED DESCRIPTION OF THE PREFERRED EMBODIMENTS

Figure 1:
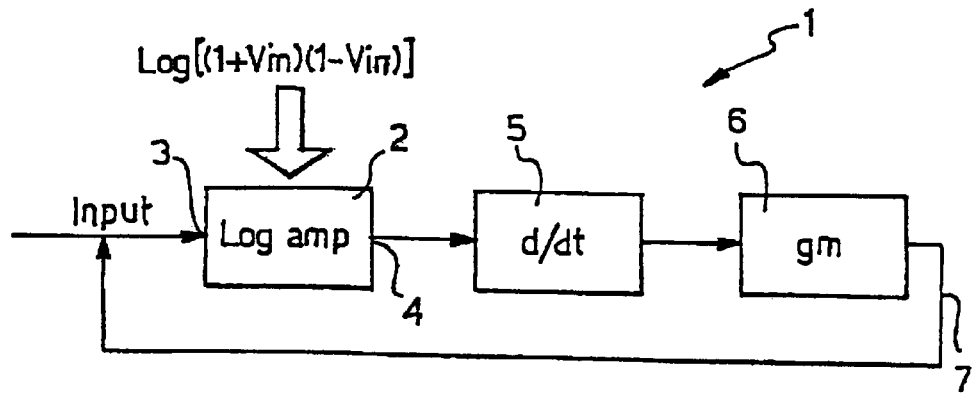
FIG. 1 is a block diagram of a first embodiment of an electronic circuit in accordance with the present invention.

Referring now to FIG. 1, a block diagram of an embodiment of an integrated electronic circuit 1 in accordance with the present invention is shown. The integrated electronic circuit 1 implements a non-linear capacitor Ceq, and more specifically, a non-linear capacitor having the following relationship:

$$C = C_0 \cdot \frac{1}{1 - k \cdot V_c^2}$$

where $V_c$ is an input voltage; k is a gain factor of the quadratic term (i.e., the term that defines the non-linearity value), and $C_o$ is the value of the capacitor when the input voltage in null (i.e., $V_c = 0$).

The electronic circuit 1 includes a first logarithmic amplifier block 2 receiving an input current Iin at an input terminal 3. The amplifier block 2 has an output 4 connected to an input of a derivative block 5 performing a d/dt function on the input current signal. A final gain block 6 is connected in cascade downstream of the derivative block 5.

A feedback connection 7 closes a feedback loop between the output of the gain block 6 and the input terminal 3. The present invention is implemented by interconnecting several blocks into a feedback loop as shown in FIG. 1, thus forming a non-linear capacitor.

The implemented function will be explained by starting with the relationship between voltage and current at the input terminals of the electronic circuit 1:

$$I_{in} = gm \cdot \frac{d}{dt}\left(\log\left(\frac{1 + V_{in}}{1 - V_{in}}\right)\right)$$

As may be appreciated, the gain term gm represents the function of the gain block 6, the d/dt portion in parenthesis is the operative result presented by the output of the derivative block 5 while the logarithmic block 2 works on the input voltage signal Vin.

Solving the derivative term:

$$\frac{d}{dt}\left(\log\left(\frac{1+V_{in}}{1-V_{in}}\right)\right) = \frac{1}{\left(\frac{1+V_{in}}{1-V_{in}}\right)} \cdot \frac{\frac{dV_{in}}{dt}\cdot(1-V_{in}) + \frac{dV_{in}}{dt}\cdot(1+V_{in})}{(1-V_{in})^2}$$

and simplifying:

$$\frac{\frac{dV_{in}}{dt}\cdot(1-V_{in}+1+V_{in})}{(1+V_{in})\cdot(1-V_{in})} = \frac{2\cdot\frac{dV_{in}}{dt}}{(1-V_{in}^2)}$$

a final result according to the following relationship (Eq. 1) is obtained:

$$I_{in} = gm \cdot \frac{d}{dt}\left(\log\left(\frac{1+V_{in}}{1-V_{in}}\right)\right) = gm \cdot \frac{2}{(1-V_{in}^2)} \cdot \frac{dV_{in}}{dt} \quad \text{Eq. 1}$$

The relationship between voltage and current for a nonlinear capacitor is the following:

$$I_c = C(V_C) \cdot \frac{dV_c}{dt} \quad \text{Eq. 2}$$

By comparing equations 1 and 2, a new relationship may be obtained (Eq. 3):

$$C(V_C) = gm \cdot \frac{2}{(1-V_{in}^2)} \quad \text{Eq. 3}$$

This equation (Eq. 3) gives a relationship between current and voltage that follows the required behavior, except for a k factor that could be easily added by inserting a gain stage before the logarithmic amplifier 2.

Figure 2:
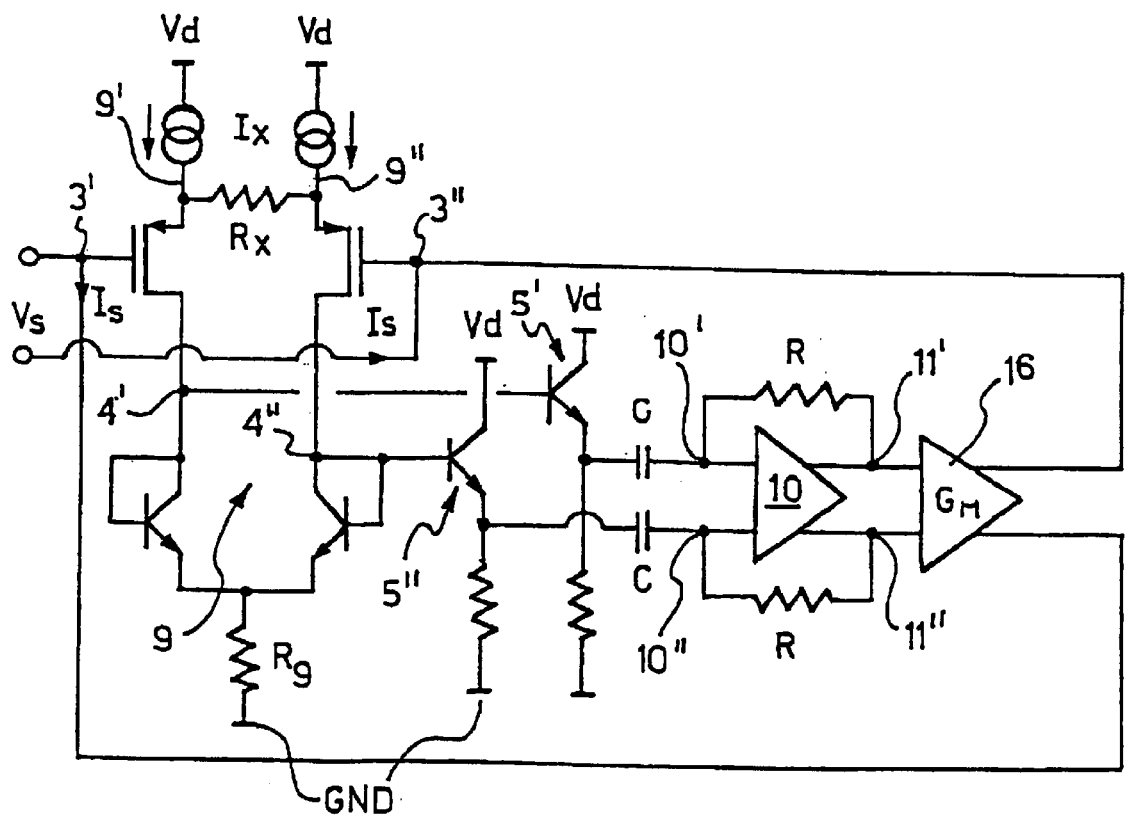
FIG. 2 is a detailed schematic diagram of the electronic circuit in accordance with the present invention.

One possible embodiment of the circuit 1 is shown in the schematic diagram of FIG. 2. The logarithmic amplifier block 2 is implemented by a transconductance differential cell 9 having differential current inputs 3', 3" and corresponding current outputs 4', 4". The cell 9 has two symmetric transistors branches 9', 9" each coupled to a first voltage supply reference Vd through a current generator Ix, and to a second voltage reference GND through a resistor R9, or as an alternative, a current generator.

The transistors of each branch 9', 9" could be bipolar transistors, or a bipolar transistor and a MOS transistor. More specifically, two input MOS transistors and two out bipolar transistors are used in this embodiment. The current inputs 3', 3" are set between the current generator Ix and the gate electrode of the first transistor of each branch 9', 9" according to FIG. 2. This is while the current outputs 4', 4" are set between the first and the second transistor of each branch.

Each current output 4', 4" is connected to the driving terminal of a bipolar transistor 5', 5" having the first conduction terminal respectively coupled to the first voltage reference Vd and to the second voltage reference GND. The second conduction terminal of each transistor 5', 5" is coupled to the second voltage reference GND through a resistor or a current generator.

The second conduction terminal of each transistor 5', 5" is also coupled through a capacitor C to a corresponding input terminal 10', 10" of a double ended gain stage 10 having a resistor R feedback connected between each output 11', 11" and each input. Both the output terminals 11', 11' of the gain stage 10 are connected to a double ended final gain block 16 having a gain factor $G_M$. The outputs of the gain block 16 are feedback connected to the inputs terminals 3', 3" thus closing the feedback loop 7.

A resistor Rx is connected between the source electrodes of the first transistors, and an input voltage Vs is applied to the driving terminals of the input MOS transistors of the first logarithmic amplifier block 2. The activity of the electronic circuit 1 shown in FIG. 2 may be summarized by the following relationship:

$$Is = G_M \cdot R \cdot C \cdot V_T \frac{d}{dT}\left\{\ln\left(\frac{1+\frac{Vs}{RxIx}}{1-\frac{Vs}{RxIx}}\right)\right\} = Ceq\frac{dVs}{dt}$$

where Is is the input current, $G_M$ is the gain value of the gain block 16, Vs is the input voltage, Rx is the input resistance, Ix is the biasing current and Ceq is the equivalent capacitance value of the whole circuit 1 according to the following formula:

$$Ceq = C \cdot \frac{G_M \cdot R \cdot 2V_T}{RxIx\left[1-\left(\frac{Vs}{RxIx}\right)^2\right]} = \frac{Co}{\left[1-\left(\frac{Vs}{RxIx}\right)^2\right]}$$

The corresponding charge value is:

$$Q = \int Is \cdot dt = C \cdot R \cdot G_H \cdot V_T \ln\left\{\frac{1+\frac{Vs}{IxRx}}{1-\frac{Vs}{IxRx}}\right\}$$

Thus, the capacitance value when the voltage Vs=0 is:

$$Co = C \cdot \frac{aV_T}{IxRx} \cdot G_M \cdot R$$

Figure 3:
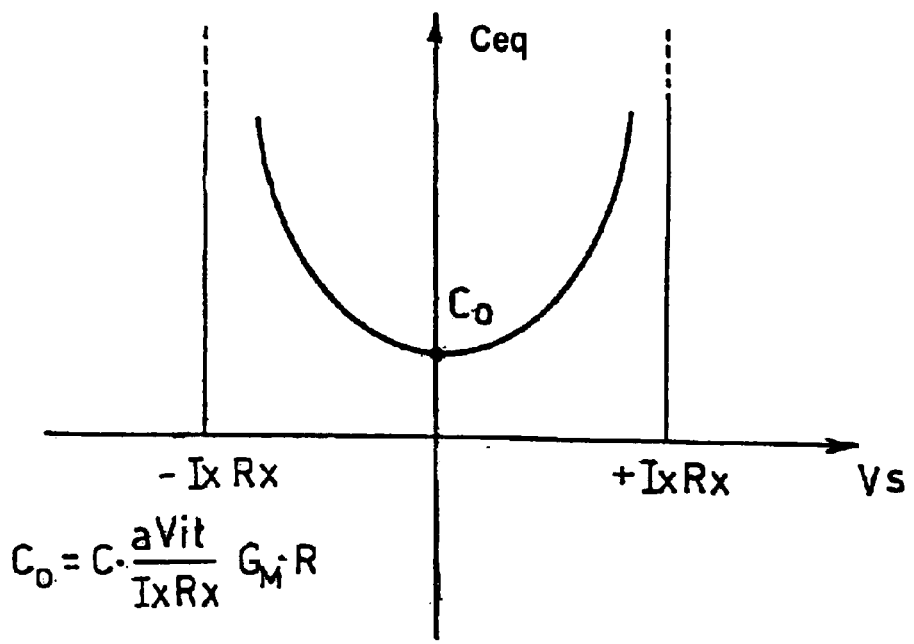
FIG. 3 is a graph showing a capacitance value versus voltage for the electronic circuit illustrated in FIG. 2.
Figure 4:
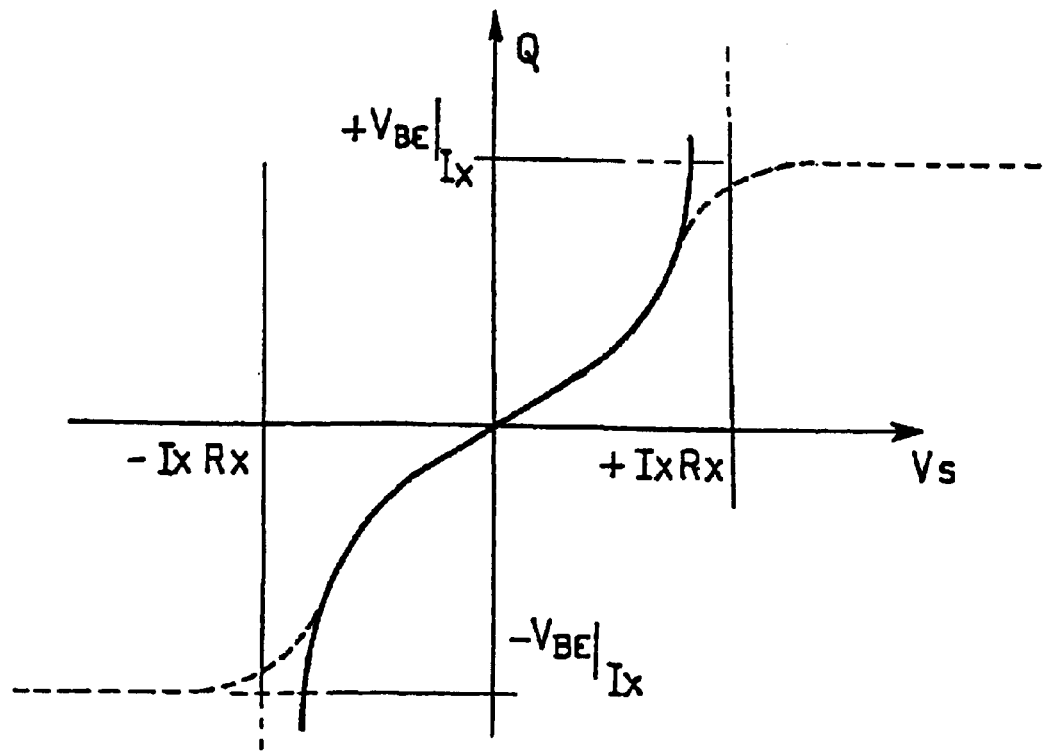
FIG. 4 is a graph showing a charge value versus voltage for the electronic circuit illustrated in FIG. 2.

The graphs in FIGS. 3 and 4 show the evolution of the capacitance value Ceq and the charge value Q versus the voltage input Vs for the circuit as described above.

Having described and illustrated the principles of the invention in a preferred embodiment thereof, it should be apparent that the invention can be modified in arrangement and detail without departing from such principles. We claim all modifications and variations within the scope of the following claims.

That which is claimed is:

1. An integrated electronic circuit comprising:
   a plurality of active circuits connected together in cascade, said plurality of active circuits comprising a logarithmic amplifier circuit; and
   a feedback loop between an output of a last active circuit and an input of a first active circuit so that said plurality of active devices function as a capacitor.

2. An integrated electronic circuit according to claim 1, wherein said plurality of active circuits further comprise a derivative circuit connected to said logarithmic amplifier circuit, and a gain circuit connected to said derivative circuit; and wherein said feedback loop is between an output of said gain circuit and an input of said logarithmic amplifier circuit.

3. An integrated electronic circuit according to claim 2, wherein said logarithmic amplifier circuit comprises a transconductor differential cell.

4. An integrated electronic circuit according to claim 1, wherein the capacitor has the following relationship:

$$C = C_0 \cdot \frac{1}{1 - k \cdot V_C^2}$$

wherein:

$V_c$ is an input voltage;

k is a gain factor of the quadratic term; and $C_o$ is a value of the capacitor when the input voltage is zero.

5. An integrated electronic circuit comprising:

a logarithmic amplifier circuit;

a derivative circuit connected to an output of said logarithmic amplifier circuit;

a gain circuit connected to an output of said derivative circuit; and a feedback loop between an output of said gain circuit and an input of said logarithmic amplifier circuit so that said logarithmic amplifier circuit, said derivative circuit, and said gain circuit function as a non-linear device.

6. An integrated electronic circuit according to claim 5, wherein the non-linear device is a capacitor.

7. An integrated electronic circuit according to claim 5, wherein said logarithmic amplifier circuit comprises a transconductor differential cell.

8. An integrated electronic circuit according to claim 6, wherein the capacitor has the following relationship;

$$C = C_0 \cdot \frac{1}{1 - k \cdot V_C^2}$$

wherein:

$V_c$ is an input voltage;

k is a gain factor of the quadratic term; and $C_o$ is a value of the capacitor when the input voltage is zero.

9. An electronic circuit comprising:

a semiconductor substrate;

a logarithmic amplifier circuit on said semiconductor substrate;

a derivative circuit on said semiconductor substrate and connected to an output of said logarithmic amplifier circuit;

a gain circuit on said semiconductor substrate and connected to an output of said derivative circuit; and a feedback loop between the output of said gain circuit and an input of said logarithmic amplifier circuit so that said logarithmic amplifier circuit, said derivative circuit, and said gain circuit function as a non-linear device.

10. An electronic circuit according to claim 9, wherein the non-linear device is a capacitor.

11. An electronic circuit according to claim 9, wherein said logarithmic amplifier circuit comprises a transconductor differential cell.

12. An electronic circuit according to claim 10, wherein the capacitor has the following relationship:

$$C = C_0 \cdot \frac{1}{1 - k \cdot V_C^2}$$

wherein:

$V_c$ is an input voltage;

k is a gain factor of the quadratic term; and $C_o$ is a value of the capacitor when the input voltage is zero.

13. A method for providing a non-linear device comprising:

connected a plurality of active circuits comprising a logarithmic amplifier circuit; and providing a feedback loop between an output of a last active circuit and an input of a first active circuit so that the plurality of active circuits function as a capacitor.

14. A method according to claim 13, wherein the plurality of active circuits further comprises a derivative circuit, and a gain circuit connected together; and wherein the feedback loop is between an output of the gain circuit and an input of the logarithmic amplifier circuit.

15. A method according to claim 13, wherein the logarithmic amplifier circuit comprises a transconductor differential cell.

16. A method according to claim 13, wherein the capacitor has the following relationship:

$$C = C_0 \cdot \frac{1}{1 - k \cdot V_C^2}$$

wherein:

$V_c$ is an input voltage;

k is a gain factor of the quadratic term; and $C_o$ is a value of the capacitor when the input voltage is zero.

* * * * *

UNITED STATES PATENT AND TRADEMARK OFFICE
CERTIFICATE OF CORRECTION

PATENT NO.     : 6,777,998 B2
DATED          : August 17, 2004
INVENTOR(S)    : Maurizio Zuffada et al.

It is certified that error appears in the above-identified patent and that said Letters Patent is hereby corrected as shown below:

Column 1,
Line 22, delete "non-liner" insert -- non-linear --

Column 3,
Line 49, delete "out" insert -- output --

Column 6,
Line 22, delete "connected a plurality of active circuits" insert -- connecting a plurality of active circuits together in cascade, the plurality of active circuits --

Signed and Sealed this

Twenty-ninth Day of March, 2005

JON W. DUDAS
*Director of the United States Patent and Trademark Office*